United States Patent [19]

Chihak

[11] Patent Number: 4,486,752

[45] Date of Patent: Dec. 4, 1984

[54] PULSE WIDTH DISCRIMINATOR APPLICABLE TO ATC TRANSPONDERS

[75] Inventor: Paul P. Chihak, Atkins, Iowa

[73] Assignee: Rockwell International Corporation, El Segundo, Calif.

[21] Appl. No.: 362,699

[22] Filed: Mar. 29, 1982

[51] Int. Cl.$^3$ .......................... H03K 5/22; H04Q 9/00
[52] U.S. Cl. ............... 340/825.63; 307/234; 328/111; 343/6.8 LC
[58] Field of Search ............... 329/106; 343/6.8 R, 343/6.8 LC; 377/50; 340/825.63, 825.64; 328/111, 112, 119; 307/234

[56] References Cited

U.S. PATENT DOCUMENTS

| | | | |
|---|---|---|---|
| 3,678,392 | 7/1972 | Houghton | 340/825.63 |
| 3,790,881 | 2/1974 | Smith | 328/111 |
| 3,938,146 | 2/1976 | Dano | 328/119 |
| 3,944,982 | 3/1976 | Mogi et al. | 340/825.63 |
| 3,949,199 | 4/1976 | Odom | 328/111 |
| 3,984,775 | 10/1976 | Cariel et al. | 340/825.63 |
| 4,095,125 | 6/1978 | Ingle | 307/234 |

Primary Examiner—Donald J. Yusko
Attorney, Agent, or Firm—George A. Montanye; H. Fredrick Hamann

[57] ABSTRACT

A pulse width discriminating circuit and technique is disclosed which enables the rejection of pulses having a width less than and greater than predetermined limits. A received pulse is provided as one input to a counting circuit which is driven by a clock to provide count outputs as long as an input pulse is present. The counter has an output selected to indicate when the width of the pulse has exceeded a minimum time, and an output selected to indicate when the width of the pulse has exceeded a maximum time. The minimum pulse width output signal controls the entry of a pulse in a shift register. The shift register is shifted by a divided clock signal from the same clock that drives the counter and provides an output to a decoding circuit after a predetermined time if the pulse width falls within the predetermined range. The maximum pulse width output signal is coupled to reset the shift register so that the pulse in the shift register is discarded if the input pulse exceeds a predetermined width.

10 Claims, 1 Drawing Figure

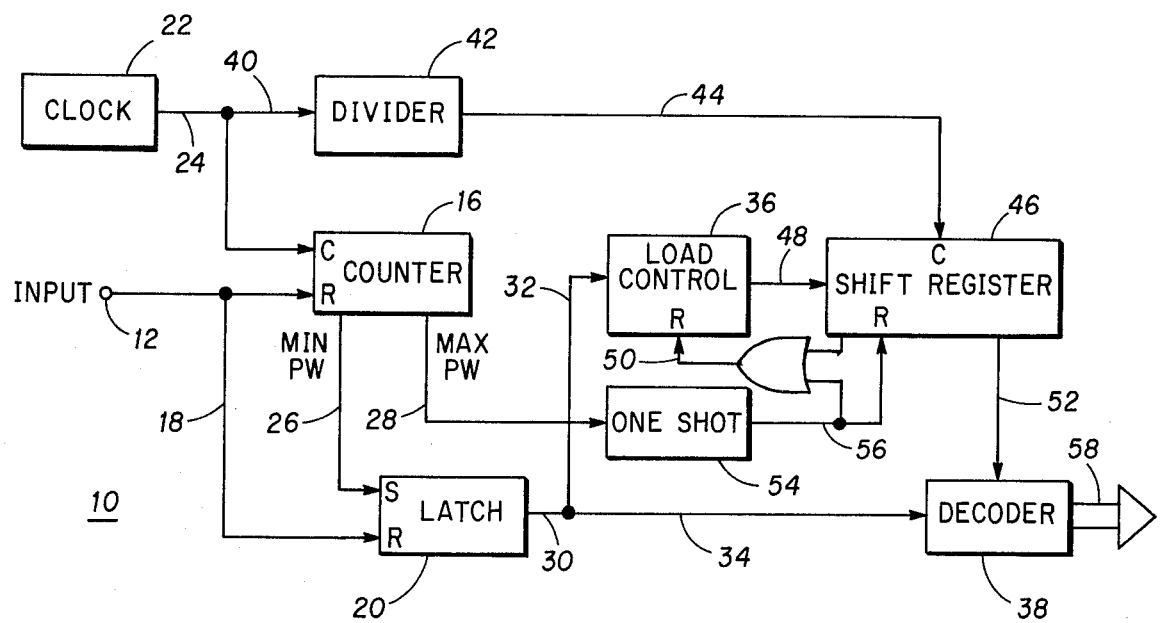

PULSE WIDTH DISCRIMINATOR APPLICABLE TO ATC TRANSPONDERS

BACKGROUND OF THE INVENTION

The present invention relates to digital signal detecting circuitry and more particularly to a digital circuit which enables pulse width discrimination.

In a variety of electronic systems, information transmission and reception is often accomplished and controlled by the generation of pulses representing digital information. The pulses may be of a variety of configurations and may include modulation of their width, height and repetition frequency in order to convey certain information. Naturally, in any such system, the accuracy of the information transmitted is dependent upon the effective detection of the pulses so that unwanted or spurious signals may be separated from the transmitted pulses.

In one technique of transmitting information by digital pulses, the width of the transmitted pulses is fixed within predetermined limits so that the pulse may be distinguished from other signals. In this instance, if an unwanted signal of any magnitude, repetition or duration is received from a spurious source, it may be easily distinguished if its duration falls outside of the predetermined limits. By way of example, pulse width detection is used in aircraft transponders wherein the timing of a series of transmitted pulses is intended to elicit particular information from an aircraft. As can be appreciated, when such timing is critical to determining the mode of aircraft response, it is important that unwanted pulses are not detected as interrogation pulses so that they interfere with the interrogation timing sequence.

In the prior art, pulse width discrimination in transponder and other aircraft system has been generally accomplished by employing lumped delay lines and analog delays. Lumped delay lines, however, are bulky and cannot be easily used with the miniaturized digital circuits employed in new technology aircraft. Analog delay circuits are also bulky and suffer from additional deficiencies. Specifically, analog delays have a tendency to drift and require frequent adjustment in order to maintain the precise delay times needed for enabling pulse width discrimination. Neither of these techniques, are capable of providing the fixed, stable and reproducible delay times needed for distinguishing critical pulse widths. There is therefore a continuing need for digital circuitry which can provide such reproducible characteristics and enable pulse width detection and discrimination in a variety of digital circuits.

Accordingly, the present invention has been developed to overcome the shortcomings of the above known and similar techniques, and more particularly, to provide a digital pulse width discriminator for accurately detecting pulse width within precisely defined limits.

SUMMARY OF THE INVENTION

In accordance with the present invention, the discriminator circuit includes a counter having one input for receiving a train of transmitted pulses, an input clocked by a stable clocking circuit and outputs representing specifically timed counts. One output of the counter provides a minimum count signal when an input pulse width exceeds a predetermined minimum time period and another output of the counter provides a maximum count signal when an input pulse width exceeds a predetermined maximum time period. The input pulses and the minimum count signal are coupled as inputs to a latching circuit designed to provide temporary storage of a latching signal indicating that a minimum pulse width has been detected. The maximum count signal is coupled to a one-shot for providing a discard signal when the pulse width exceeds the predetermined maximum time period. The minimum pulse width latch signal is coupled via a load control latch to apply a timing signal to the serial input of a shift register which is clocked by a divided signal from the stable clock. The discard signal is coupled to reset the shift register and load control latch thereby rejecting the injected timing signal when the input pulse width exceeds the predetermined maximum width. In operation, the shift register will provide a delayed replica of the timing signal to appropriate decoding circuitry only when a pulse from the pulse train input falls within a predetermined range. This operation is performed for each pulse received by the counter so that the decoding circuitry only receives an indication when pulses of proper duration have been received.

It is therefore a feature of the invention to provide a simple, inexpensive and versatile technique for pulse width discrimination.

Another feature of the invention is to provide a digital pulse width detecting circuit which may be implemented with conventional technology.

A further feature of the invention is to provide a pulse width discriminating circuit which uses a digital counter to detect minimum and maximum pulse width.

Still another feature of the invention is to provide a pulse width discrimination and decoding circuit which provides decoding only when pulses falling within a predetermined timing window have been received.

Yet another feature of the invention is to provide a pulse width discriminating circuit which includes a counter and shift register for initiating a timing window upon receipt of a minimum pulse width input and for discarding the timing window if the pulse width exceeds a maximum limit.

A still further feature of the invention is to provide a digital decoding circuit which is stable in operation and insensitive to timing drifts for accurately decoding a series of pulses of predetermined width.

These and other advantages and novel features of the invention will become apparent from the following detailed description when considered with the accompanying drawing wherein:

BRIEF DESCRIPTION OF THE DRAWING

The FIGURE shows a schematic diagram of the circuit representing the pulse width discriminator and decoder in accordance with the present invention.

DETAILED DESCRIPTION OF THE PREFERRED EMBODIMENT

Referring now to the drawing, there is shown a pulse width discriminator and decoding circuit 10 in accordance with the present invention. In the present example, the description of the circuit and its operation will be made in connection with its use as part of an air traffic control (ATC) transponder. It will be understood, however, that the disclosed circuits are not restricted to avionics or similar systems but may be used in a variety of other equipments where it is desired to provide pulse width discrimination and signal decoding.

As is generally known, an ATC transponder is an instrument employed in an aircraft to automatically provide certain messages to an air traffic control center during flight in a particular geographic area. The transponders may be constructed in a variety of configurations but their primary function is to transmit specific information to the air traffic control center in response to interrogation pulses from the air traffic control center. The information, for example, may be an aircraft identification number or aircraft elevation data needed by the air traffic control center for proper flight coordination. Furthermore, aircraft location can be determined from the reply transmission. The transponders operate in response to the interrogation pulses transmitted by the air traffic control center when they are within the controlled area. Interrogations are transmitted with a coded format and formed to have pulse widths within a predetermined range. By way of example, in a given time period, the pulses may be time coded to elicit a first response by a receiving aircraft when a certain spacing of pulses is received and elicit a second response by the receiving aircraft when another spacing of pulses is received. Variations of the timing of the pulses can be made in any manner to obtain numerous responses for furnishing the required information from the interrogated aircraft.

In order to respond to the interrogation pulses transmitted by the air traffic control center, an aircraft must include receiving circuitry capable of detecting and decoding the series of transmitted pulses provided by the air traffic control center. After the pulses are detected and decoded, specific circuitry generates a response which causes the aircraft to automatically transmit the information requested by the coded pulsed interrogations. The information is transmitted each time a proper interrogation is made, thereby continuously providing the air traffic control center with up-dated information. In this manner, the control center may monitor any number of aircraft within its vicinity merely by transmitting appropriate interrogation signals to obtain specific information from those aircraft.

In the operation of the above system, it can be appreciated that proper responses from an interrogated aircraft are only transmitted if the aircraft receiving circuitry accurately receives, detects, and decodes the interrogation pulses. An important part of the detection technique requires the receiving system to be capable of distinguishing between interrogation pulses and other electromagnetic pulses caused by unwanted or spurious sources. Such unwanted signals can cause needless transponder operation as well as inhibit proper transponder response to interrogation signals. Accordingly, in order to more easily identify the interrogation pulses, they are generally transmitted with a pulse width falling within a predetermined range of values. Since the pulse width range is the standard, any pulses formed by spurious signals and falling outside of the predetermined range are rejected by the receiving circuitry. As was previously noted, the prior art normally accomplishes such discrimination in pulse widths by employing lumped delay lines or analog delays to compare pulse widths. However, their bulkiness makes the unsuitable and undesirable for use with the current technology of miniaturized and integrated circuits. In addition, electrical drifts in analog delays require numerous undesirable adjustments for proper operation. In current aircraft systems, such circuits take up more room, are more expensive to construct, are more complex in operation and require more repair and adjustment time than is acceptable for flight conditions.

In accordance with the present invention, a digital pulse width discriminator and decoder is constructed which is compatible with current miniaturized high-speed integrated circuit technology and accurately detects and decodes pulses having a width falling within a predetermined range. In the drawing, the discriminator and decoder 10 includes input terminal 12 which receives a train of input pulses, such as ATC interrogation pulses. The input 12 may be coupled to receive such pulses from any conventional aircraft receiving circuitry, the details of which are unimportant to the description of the present invention. The signal at input 12 is coupled over line 14 as one input to a reset terminal R of counter 16. The signal input from 12 is also coupled over line 18 to a reset terminal R of latch circuit 20. The counter 16 may be of any conventional construction and may typically be a digital counter wherein the signal from 12 is coupled to the counter to enable the counter 16 on the leading edge of a pulse input to terminal 12. The counter 16 is designed to have a clock input C which responds to a clock signal from clock 22 causing the counter to count as long as there is a pulse input at terminal 12. In the present example, the counter 16 counts in response to digital pulses received from clock 22 over line 24. In the description which follows, the signals will be described with reference to the use of conventional "zero" and "one" logic levels, although it will be understood that any logic level or combination of levels could be used as long as the described functional cooperation is obtained.

Normally, the pulse input received from terminal 12 is preconditioned in a conventional manner to provide a voltage pulse of predetermined magnitude representing a logic zero. Clock 22 is likewise constructed to provide a series of clock pulses represented by alternating periods of logic ones and zeros, which when coupled over line 24 to counter 16, cause the counter to count as long as a pulse is present on line 14. Two output signals are taken from the counter 16 on lines 26 and 28. The output signal from line 26 is normally a logic zero until the count reaches a predetermined minimum count (representing a time period corresponding to a minimum desired pulse width) when it changes to a logic one. Thus, after receipt of an input pulse at terminal 12, the counter 16 counts and provides an output signal on line 26 if the pulse remains as input to terminal 12 until the counter 16 reaches the minimum count. In the same manner, the output signal on line 28 is normally a logic zero until the count reaches a predetermined maximum count (representing a time corresponding to a maximum desired pulse width) when it changes to a logic one. Again, the counter will only provide an output signal on line 28 if the pulse input to terminal 12 remains until the count has reached the maximum count. In both cases, if a pulse input from 12 is not maintained on line 14 to the counter 16 until the count for each of the outputs 26 and 28 has been reached, there will be no signal output from line 26 or 28. Additionally, when the pulse input to 12 terminates, the counter 16 resets to zero and the latch 20 also resets to zero.

The minimum count signal from counter 16 is provided over line 26 to latch 20 as shown in the drawing. The latch 20 is constructed as a conventional digital logic circuit wherein the input pulse at terminal 12 is coupled through line 18 to the reset input R of the latch. In this example, during the absence of an input pulse, a constructed to be enabled upon receipt of the leading edge of an input pulse and which incrementally counts during the presence of an input pulse, said first signal being provided as a minimum count signal when said pulse remains as input to said counter for a time exceeding a predetermined minimum time period and said second signal being provided as a maximum count signal when said input pulse remains as input to said counter for a time exceeding a predetermined maximum time period.

4. The apparatus of claim 2 wherein said means for providing a timing signal includes:
   a digital latch circuit coupled to receive said input pulse and said first signal and provide a latch signal when said input pulse and said first signal are concurrently present at said latch; and
   control means responsive to said latch signal for providing said timing signal.

5. The apparatus of claim 4 wherein said control means has an input, an output and a reset terminal, said control input terminal being coupled to receive said latch signal and provide said timing signal in response thereto and said control reset terminal being constructed to remove said timing signal in response to a reset signal.

6. A pulse width discriminating apparatus comprising:
   means for receiving an input pulse and providing a first signal when said input width exceeds a predetermined minimum time period and providing a second signal when said input pulse width exceeds a predetermined maximum time period, said means for receiving said input pulse comprising a digital counter constructed to be enabled upon receipt of a leading edge of an input pulse and which incrementally counts during the presence of an input pulse, said first signal being provided as a minimum count signal when said pulse remains as input to said counter for a time exceeding a predetermined minimum time period and said second signal being provided as a maximum count signal when said input pulse remains as input to said counter for a time exceeding a predetermined maximum time period;
   means responsive to said first signal and said input pulse for providing a timing signal and including a digital latch circuit coupled to receive said input pulse and said first signal and provide a latch signal when said input pulse and said first signal are concurrently present at said latch and control means responsive to said latch signal for providing said timing signal, said control means having an input, an output and a reset terminal, said control means input terminal being coupled to receive said latch signal and provide said timing signal in response thereto and said control means reset terminal being constructed to remove said timing signal in response to a reset signal; and
   means coupled to receive said timing signal for providing said timing signal as an output when said input pulse width exceeds a predetermined minimum time period and responsive to said second signal for discarding said timing signal to prevent an output of said timing signal when said input pulse width exceeds a predetermined maximum time period, said means for receiving said timing signal including a shift register coupled to receive and shift said timing signal along said register, said shift register providing a reset signal to said control means reset terminal a first predetermined time after receipt of a timing signal and providing said timing signal as an output a second predetermined time after receipt of said timing signal, said register being responsive to a reset signal for preventing timing signal output when the width of said input pulse exceeds said predetermined maximum time period.

7. The apparatus of claim 6 wherein said means for receiving said timing signal further includes a one-shot circuit coupled to receive said maximum count signal and provide a discard signal as the reset signal to said shift register and said control means when said input pulse exceeds a predetermined maximum time period.

8. The apparatus of claim 7 further including a decoding means coupled to receive said latch signal and said timing signal for providing a decoding output when said input pulse width falls within a range between said minimum and maximum time periods.

9. A pulse width discriminating apparatus comprising:
   clock means for providing a train of clock pulses;
   counter means for receiving an input pulse and responsive to said clock means during the presence of an input pulse for providing a first minimum count signal when said input pulse width exceeds a predetermined minimum width and for providing a maximum count signal when the said input pulse width exceeds a predetermined maximum width;
   latch means coupled to said counter means and responsive to the simultaneous presence of an input pulse and said first signal for providing a latch signal;
   one-shot means coupled to said counter means and responsive to said second signal for providing a discard signal;
   load control means coupled to said latch means and responsive to a latch signal for providing a timing signal, said load control means having a reset terminal for removing said timing signal upon receipt of a reset signal; and
   shift register means coupled to said clock means, load control means and one-shot means for receiving said timing signal and shifting said timing signal along said register in response to a train of clock pulses, said shift register providing a reset signal to said load control reset terminal a first predetermined time period after receipt of said timing signal and providing said timing signal as an output a second predetermined time period after receipt of said timing signal, said shift register including a reset input coupled to said one-shot means and responsive to said discard signal for preventing said timing signal output.

10. The apparatus of claim 9 further including a divider means coupled to receive a signal from said clock means and provide a divided clock train for clocking said shift register means.

* * * * *